(12) United States Patent  
Chen et al.

(10) Patent No.: US 8,456,915 B2
(45) Date of Patent: Jun. 4, 2013

(54) PROGRAMMING NON-VOLATILE STORAGE WITH FAST BIT DETECTION AND VERIFY SKIP

(75) Inventors: Changyuan Chen, Sunnyvale, CA (US); Jeffrey Lutze, San Jose, CA (US); Yingda Dong, San Jose, CA (US); Hua-Ling Hsu, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/436,805

(22) Filed: Mar. 30, 2012

(65) Prior Publication Data

US 2012/0188824 A1 Jul. 26, 2012

Related U.S. Application Data

(62) Division of application No. 12/638,853, filed on Dec. 15, 2009, now Pat. No. 8,174,895.

(51) Int. Cl.
*G11C 11/34* (2006.01)

(52) U.S. Cl.
USPC ............. 365/185.18; 365/185.19; 365/185.2; 365/185.22; 365/185.24; 365/185.03

(58) Field of Classification Search
USPC ............... 365/185.18, 185.19, 185.2, 185.22, 365/185.24, 185.03
See application file for complete search history.

(56) References Cited

U.S. PATENT DOCUMENTS

| | | | |
|---|---|---|---|
| 6,522,580 B2 | 2/2003 | Chen | |
| 6,917,542 B2 | 7/2005 | Chen | |
| 7,073,103 B2 | 7/2006 | Gongwer | |
| 7,099,196 B2 | 8/2006 | Suh | |
| 7,180,783 B2 | 2/2007 | Kim | |
| 7,224,614 B1 | 5/2007 | Chan | |
| 7,301,817 B2 | 11/2007 | Li | |
| 7,304,893 B1 * | 12/2007 | Hemink et al. | 365/185.22 |
| 7,310,255 B2 | 12/2007 | Chan | |
| 7,355,892 B2 * | 4/2008 | Hemink | 365/185.22 |
| 7,457,162 B2 | 11/2008 | Guterman et al. | |
| 7,457,163 B2 | 11/2008 | Hemink | |
| 7,580,286 B2 | 8/2009 | Yip | |
| 7,584,391 B2 | 9/2009 | Gongwer et al. | |
| 7,596,028 B2 | 9/2009 | Chen | |
| 7,616,499 B2 | 11/2009 | Wan | |

(Continued)

OTHER PUBLICATIONS

PCT International Search Report dated Feb. 22, 2011, PCT Patent Application No. PCT/US2010/060221.

(Continued)

*Primary Examiner* — Viet Q Nguyen
(74) *Attorney, Agent, or Firm* — Vierra Magen Marcus LLP

(57) ABSTRACT

A set of non-volatile storage elements are subjected to a programming process in order to store data. During the programming process, one or more verification operations are performed to determine whether the non-volatile storage elements have reached their target. Non-volatile storage elements being programmed to a first set of one or more targets are verified to determine whether they have reached their target and are locked out of further programming if it is determined that they have reached their target. Non-volatile storage elements being programmed to the second set of one or more targets are tested to determine the number of fast programming bits. When the number of fast bits for a particular target is greater than a threshold, then programming stops for the non-volatile storage elements being programmed to the particular target.

16 Claims, 14 Drawing Sheets

U.S. PATENT DOCUMENTS

| | | | |
|---|---|---|---|
| 7,652,929 B2 | 1/2010 | Li | |
| 7,768,836 B2 | 8/2010 | Li et al. | |
| 7,894,273 B2 | 2/2011 | Li et al. | |
| 7,986,573 B2 | 7/2011 | Li | |
| 8,054,691 B2 * | 11/2011 | Hemink | 365/185.22 |
| 8,089,815 B2 | 1/2012 | Li et al. | |
| 8,174,895 B2 * | 5/2012 | Chen et al. | 365/185.19 |
| 8,213,255 B2 * | 7/2012 | Hemink et al. | 365/211 |
| 8,261,158 B2 * | 9/2012 | Thatcher et al. | 714/763 |
| 8,274,831 B2 * | 9/2012 | Mokhlesi et al. | 365/185.18 |
| 2004/0109362 A1 | 6/2004 | Gongwer | |
| 2008/0126676 A1 | 5/2008 | Li | |
| 2008/0198662 A1 | 8/2008 | Mokhlesi | |
| 2009/0147573 A1 | 6/2009 | Hemink | |
| 2011/0170358 A1 | 7/2011 | Chen et al. | |
| 2012/0014184 A1 | 1/2012 | Dutta et al. | |

OTHER PUBLICATIONS

Written Opinion of the International Searching Authority dated Feb. 22, 2011, PCT Patent Application No. PCT/US2010/060221.

Notice of Allowance dated Jan. 25, 2012, in U.S. Appl. No. 12/638,853, filed Dec. 15, 2009.

Amendment filed Dec. 13, 2011, in U.S. Appl. No. 12/638,853, filed Dec. 15, 2009.

Restriction mailed Nov. 25, 2011, in U.S. Appl. No. 12/638,853, filed Dec. 15, 2009.

Response to Office Action dated Feb. 11, 2013, European Patent Application No. 10798417.1.

* cited by examiner

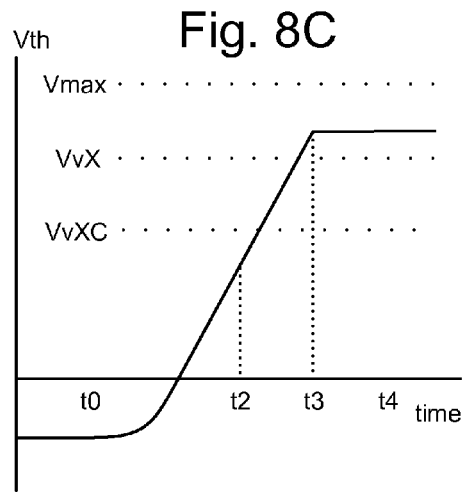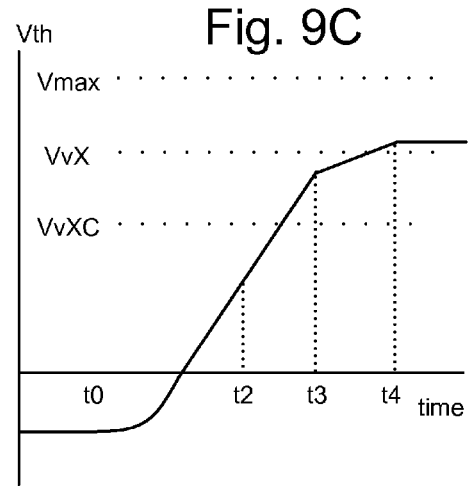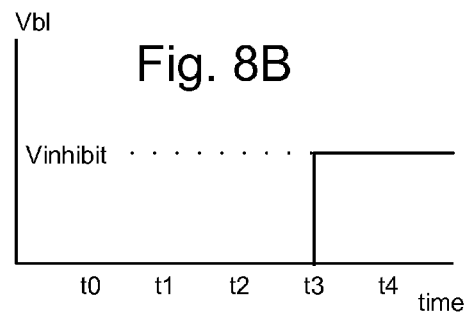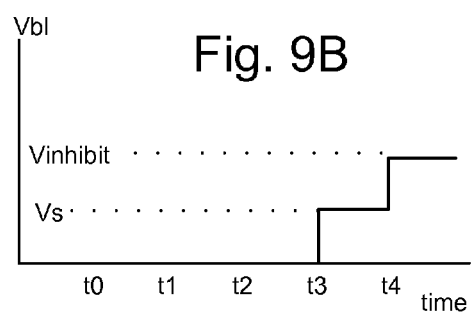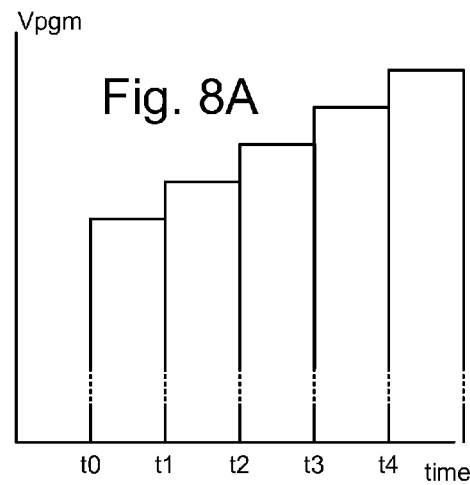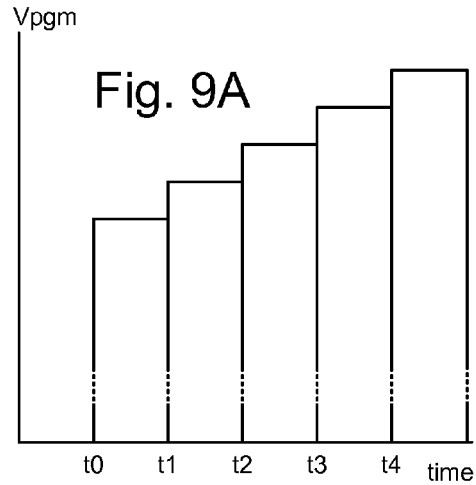

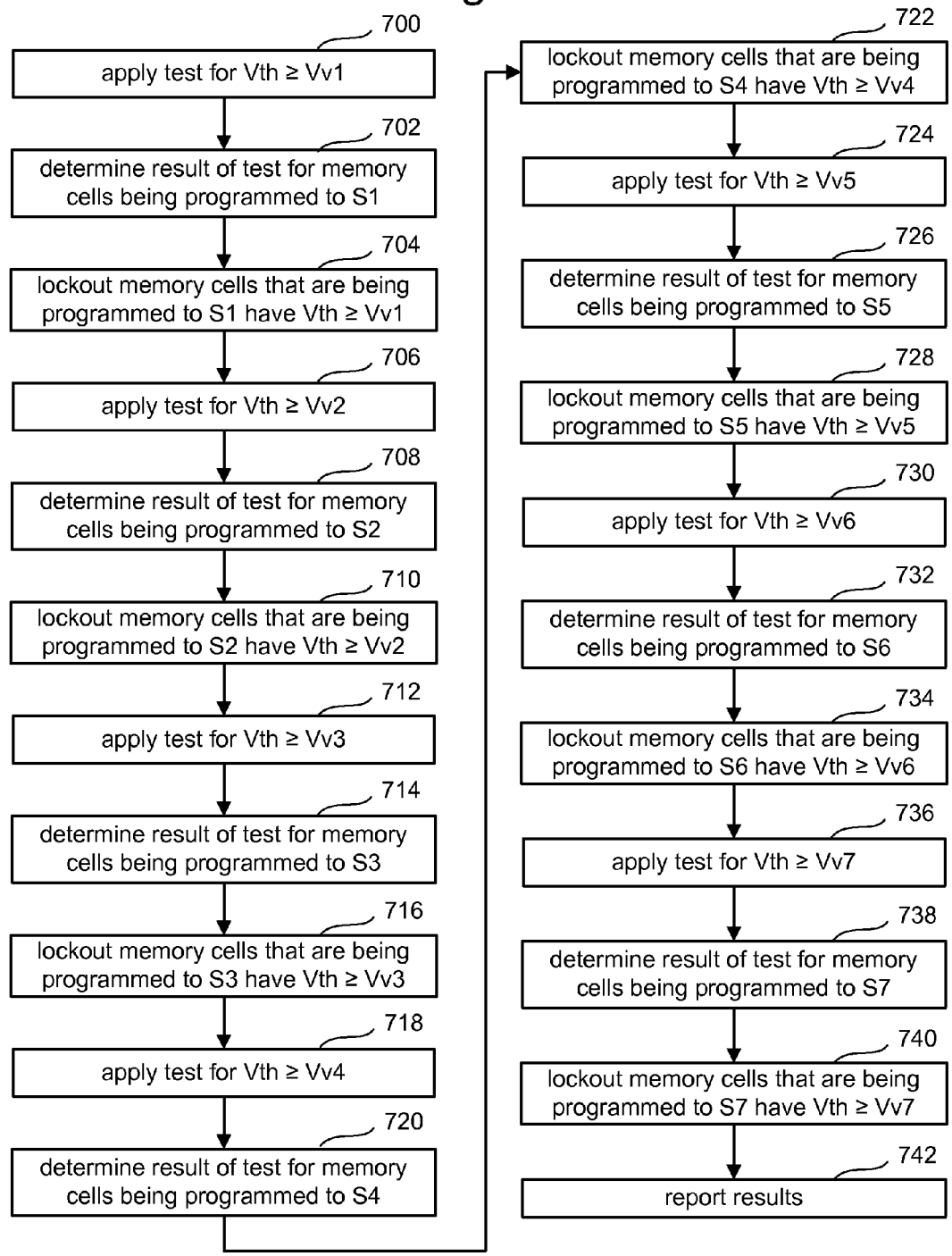

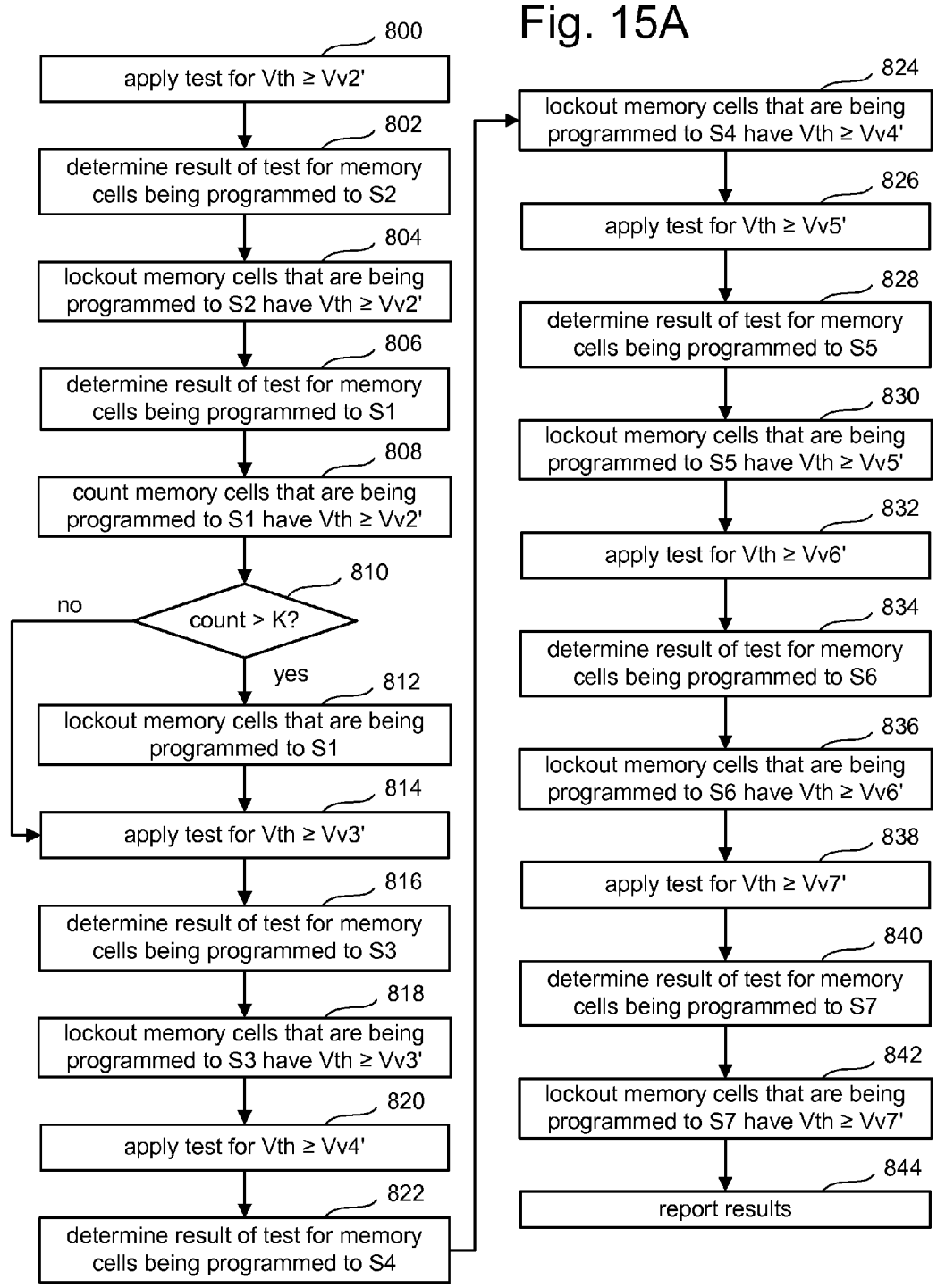

PROGRAMMING NON-VOLATILE STORAGE WITH FAST BIT DETECTION AND VERIFY SKIP

CROSS-REFERENCE TO RELATED APPLICATIONS

This is a divisional application of U.S. patent application Ser. No. 12/638,853, filed Dec. 15, 2009, published on Jul. 14, 2011 as US2011/0170358, and incorporated herein by reference.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

In some embodiments, the program voltage applied to the control gate includes a series of pulses that are increased in magnitude with each successive pulse by a predetermined step size (e.g. 0.2v, 0.3v, 0.4v, or others). Between pulses, the memory system will verify whether the individual memory cells have reached their respective target threshold voltage ranges. Those memory cells that have reached their target threshold voltage range will be locked out of future programming (e.g., by raising the bit line voltage to Vdd). When all memory cells have reached their target threshold voltage range, programming is complete.

With multi-state non-volatile storage, some systems will verify memory cells being programmed to each allowed threshold voltage range between programming pulses. The more allowed threshold voltage ranges, the longer it takes to perform the verification. Longer verification operations slow down the programming process.

BRIEF DESCRIPTION OF THE DRAWINGS

FIGS. 8A, B and C depict one embodiment of a coarse/fine programming scheme.

FIGS. 9A, B and C depict one embodiment of a coarse/fine programming scheme.

FIG. 13 is a flow chart describing one embodiment of a process for verifying non-volatile memory during programming.

FIG. 15A is a flow chart describing one embodiment of a process for verifying non-volatile memory during programming.

DETAILED DESCRIPTION

A set of non-volatile storage elements are subjected to a programming process in order to store data. During the programming process, one or more verification operations are performed to determine whether the non-volatile storage elements have reached their target. Non-volatile storage elements being programmed to a first set of one or more targets are verified to determine whether they have reached their target and are locked out of further programming if it is determined that they have reached their target. Non-volatile storage elements being programmed to the second set of one or more targets are tested to determine the number of fast programming bits. When the number of fast bits for a particular target is greater than a threshold, then programming stops for the non-volatile storage elements being programmed to the particular target.

Figure 1:
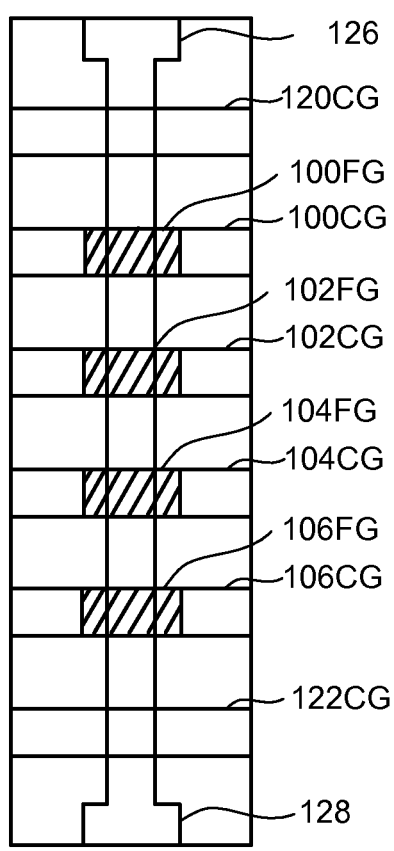
FIG. 1 is a top view of a NAND string.
Figure 2:
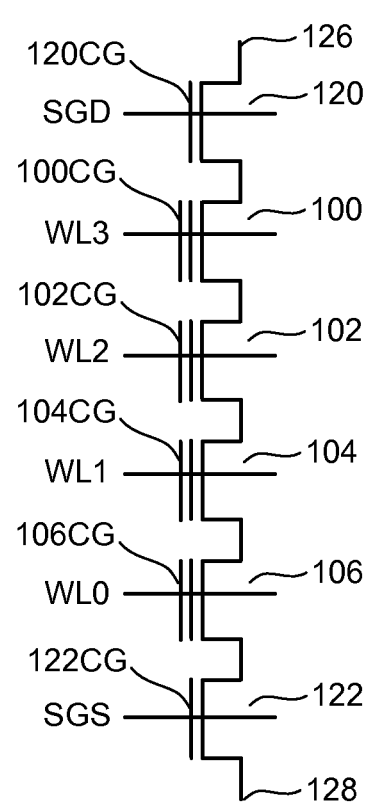
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
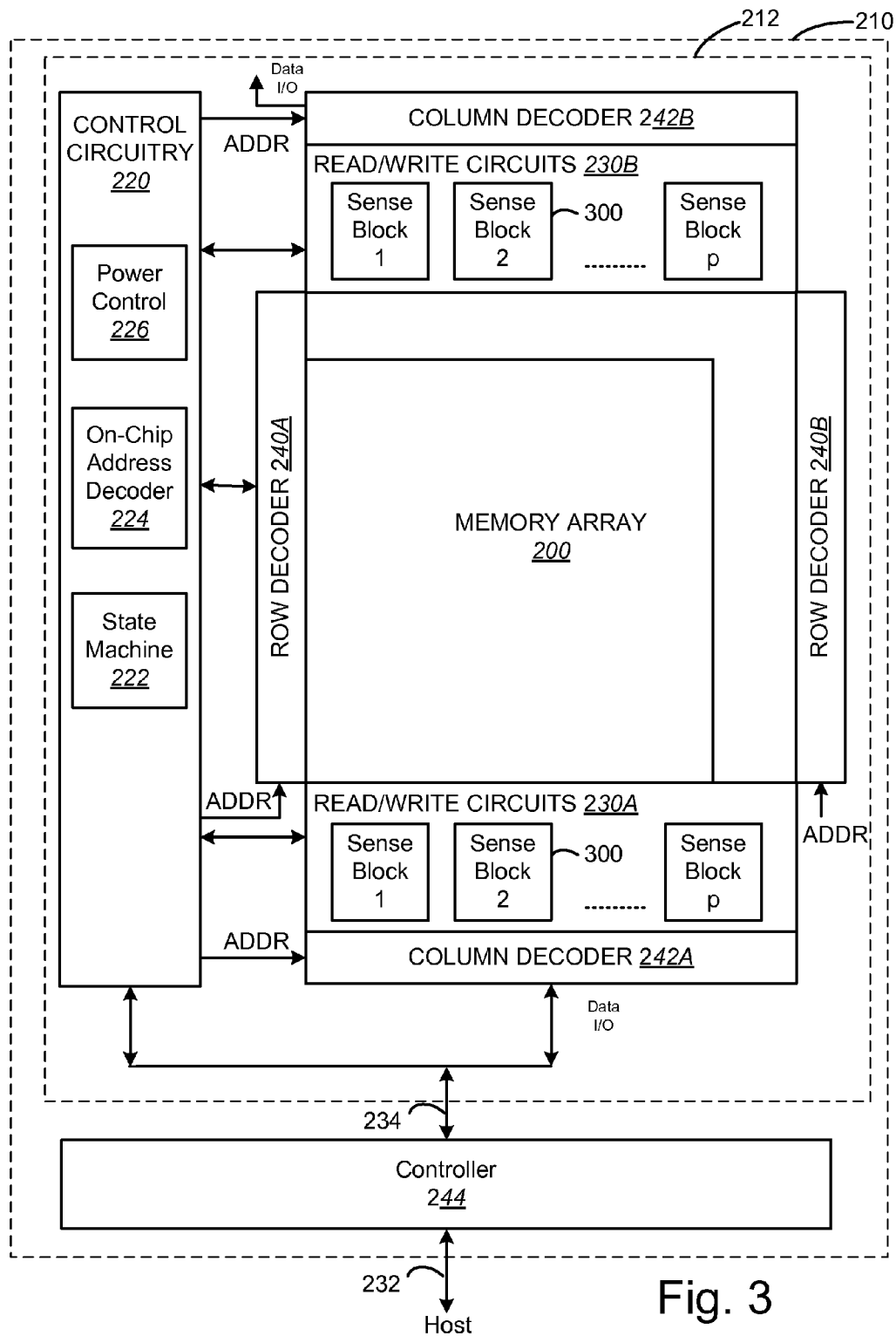
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
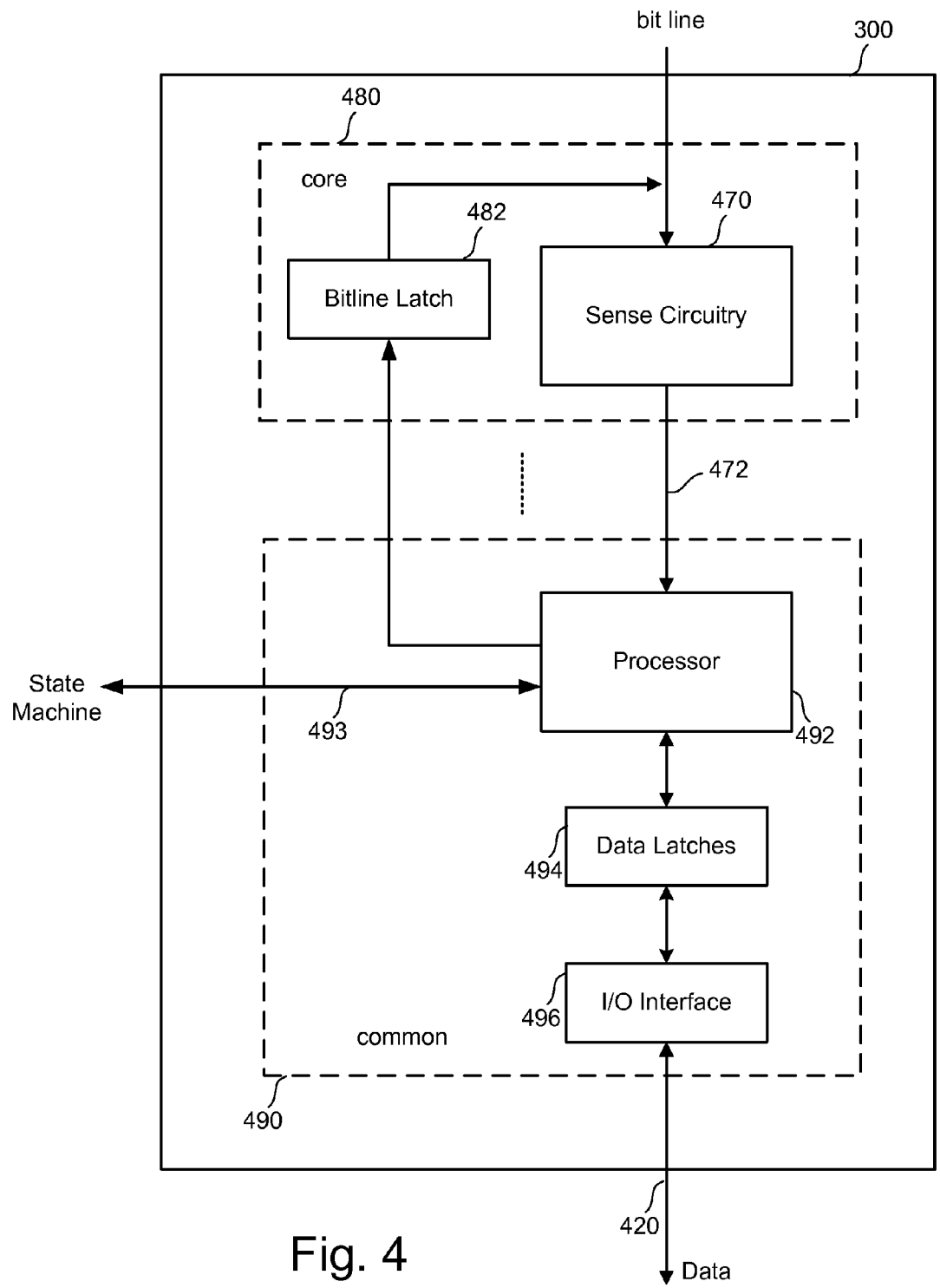
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in come embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S.

Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5A:
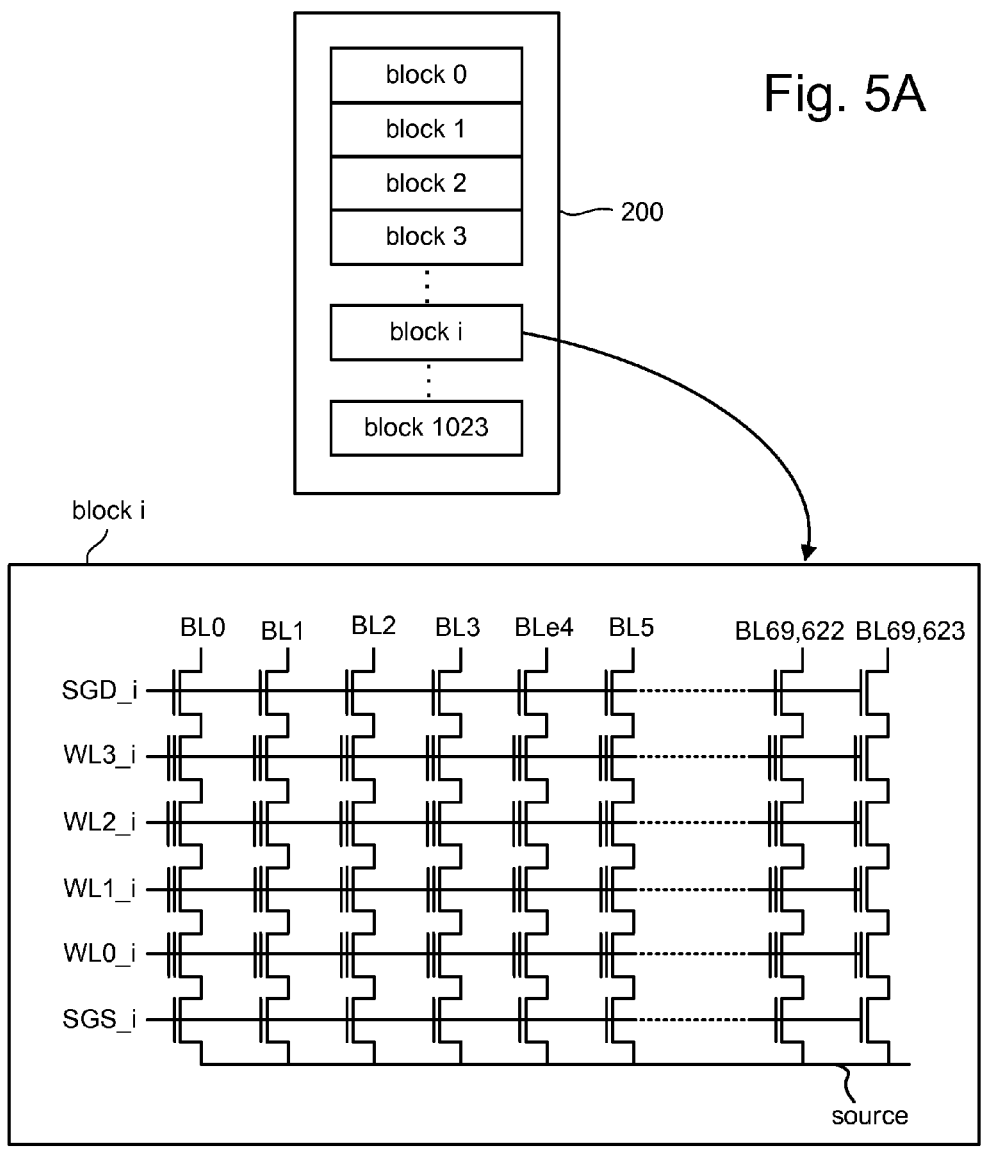
FIG. 5A is a block diagram depicting one embodiment of a memory array.

FIG. 5A depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together.

As one example, a NAND flash EEPROM is depicted in FIG. 5A that is partitioned into 1,024 blocks. However, more or less than 1024 blocks can be used. In each block, in this example, there are 69,624 columns corresponding to bit lines BL0, BL1, ... BL69,623. In one embodiment, all the bit lines of a block can be simultaneously selected during read and program operations. Memory cells along a common word line and connected to any bit line can be programmed (or read) at the same time. In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5A shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Figure 5B:
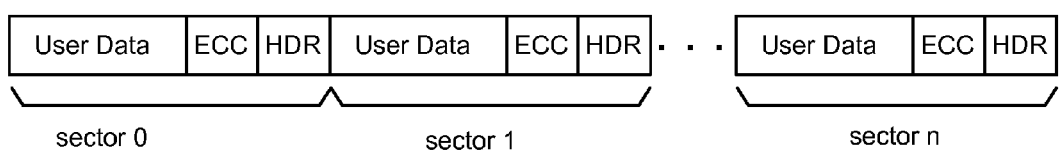
FIG. 5B depicts a page of data.

FIG. 5B depicts data for a page. Depending on the size of the page, the page contains many sectors. Each sector includes user data, error correction codes (ECC), and header information.

In some memory systems utilizing multi-state memory cells, each bit of data in a memory cell is in a different page. For example, if an array of memory cells store three bits of data (eight states or levels of data) per memory cell, each memory cell stores data in three pages with each of the three bits being on a different page. Thus, within a block in this example, each word line is associated with three pages or an integer multiple of three pages. Other arrangements are also possible.

The use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" (or original data) data bits being encoded. For example, the storage of error correction coded data in a memory resource involves the encoding of one or more code words to include the actual data and the additional code bits, using a selected code. Retrieval of the stored data involves the decoding of the stored code words according to the same code as used to encode the stored code words. Because the code bits "over-specify" the actual data portion of the code words, some number of error bits can be tolerated, without any loss of actual data evident after decoding.

Many ECC coding schemes are well known in the art. These conventional error correction codes are especially useful in large scale memories, including flash (and other non-volatile) memories, because of the substantial impact on manufacturing yield and device reliability that such coding schemes can provide, allowing devices that have a few non-programmable or defective cells to be useable. Of course, a tradeoff exists between the yield savings and the cost of providing additional memory cells to store the code bits (i.e., the code "rate"). Some ECC codes for flash memory devices tend to have higher code rates (i.e., a lower ratio of code bits to data bits) than the codes used in data communications applications (which may have code rates as low as ½).

Some memory cells are slower to program or erase than others because of manufacturing variations among those cells, because those cells were previously erased to a lower threshold voltage than others, because of uneven wear among the cells within a page, or other reasons. And, of course, some cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

Error correction is typically performed on a sector-by-sector basis. Thus, each sector will have its own set of ECC codes. This error correction is convenient and useful because, in one embodiment, the sector is the desired unit of data transfer to and from the host system.

Figure 6A:
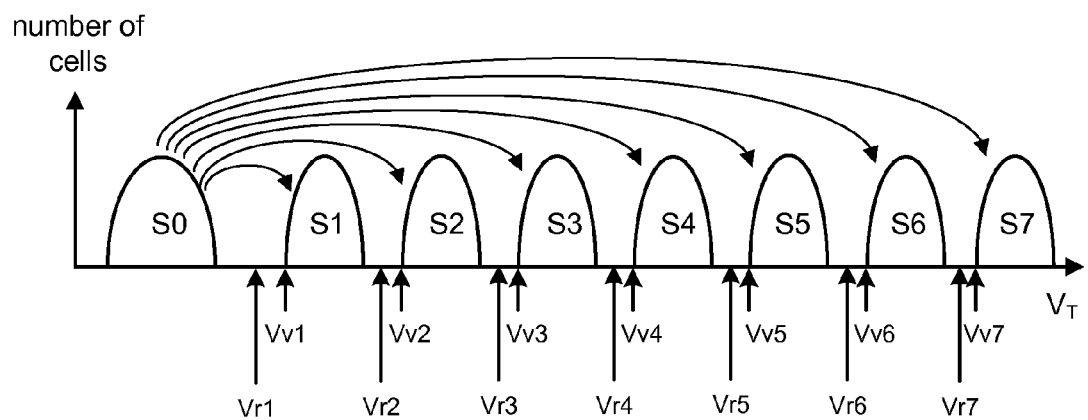
FIG. 6A depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example threshold voltage distributions for the memory cell array when each memory cell stores three bits of data. Other embodiments, however, may use more or less than three bits of data per memory cell (e.g., such as three bits of data per memory cell).

In the example of FIG. 6A, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 6A.

FIG. 6A shows a set of verify target levels Vv1, Vv2, Vv3, Vv4, Vv5, Vv6, and Vv7. These verify levels are used as comparison levels during the programming process. For example, when programming memory cells to state S1, the system will check to see if the threshold voltages of the memory cells has reached Vv1 If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

Figure 6B:
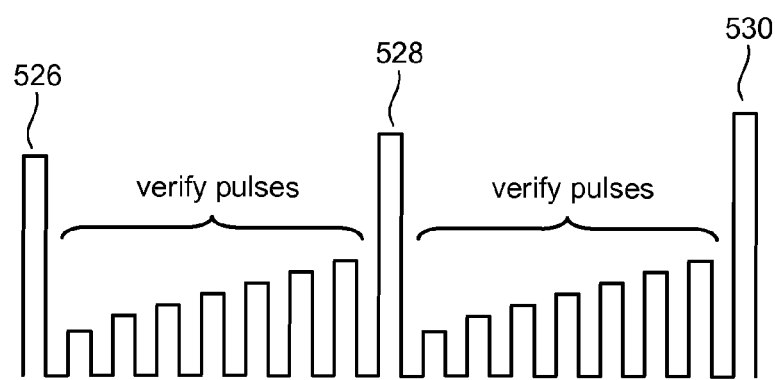
FIG. 6B depicts three programming pulses, and the verify pulses applied between the programming pulses.

FIG. 6B also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 6A) or verify operation (e.g. see verify target levels Vv1, Vv2, Vv3, Vv4, Vv5, Vv6, and Vv7 of FIG. 6A) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

In some embodiments, the program voltage applied to the control gate includes a series of pulses that are increased in magnitude with each successive pulse by a predetermined step size (e.g. 0.2v, 0.3v, 0.4v, or others). Between pulses, some memory systems will verify whether the individual memory cells have reached their respective target threshold voltage ranges. For example, FIG. 6B shows a portion of a signal applied to the control gates of a plurality of memory cells connected to a common word line. FIG. 6B shows programming pulses 526, 528 and 530, with a set of verify pulses between the programming pulses. When performing full sequence programming in one embodiment, the verification process between programming pulses will test for each of the threshold voltage distribution (data states) S1-S7. Therefore, FIG. 6B shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 6A have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. 7,301,817; US. Patent App. 2004/0109362; and US. Patent App. 2009/0147573.

Figure 7A:
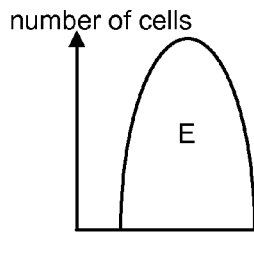
FIGS. 7A-E show various threshold voltage distributions and describe a process for programming non-volatile memory.
Figure 7B:
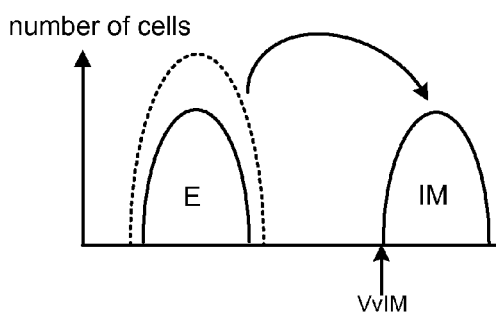

FIG. 6A shows a programming process that includes one phase where all memory cells connected to the same word line are programmed concurrently during that one phase. FIG. 7 illustrates a multi-phase programming approach. In this embodiment, the programming process includes three phases. Prior to programming, the memory cells are erased so that all memory cells connected to a common word line are in an erased threshold voltage distribution E, as depicted in FIG. 7A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 7B. Memory cells being programmed to intermediate state IM are programmed to a target threshold voltage of VvIM.

Figure 7C:
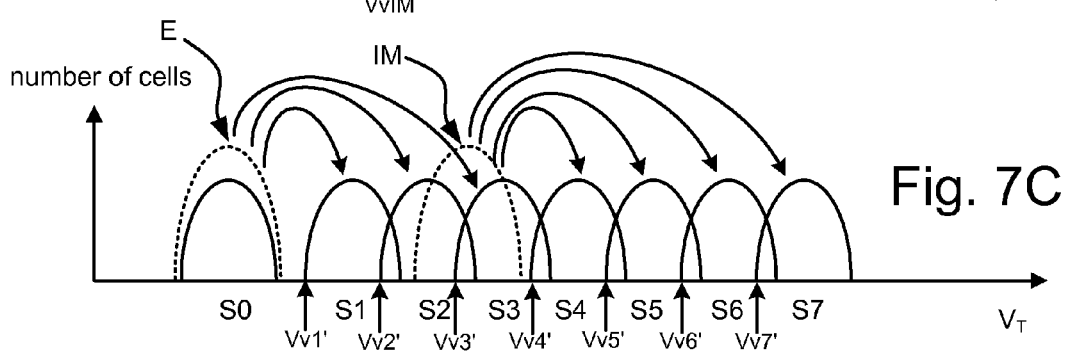
Figure 7D:
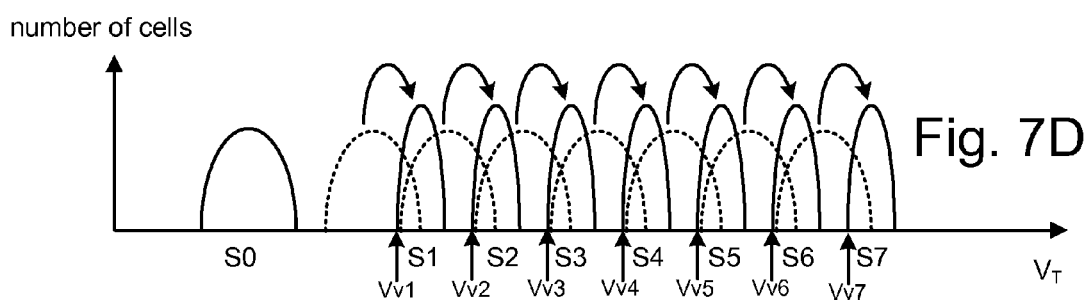
Figure 7E:
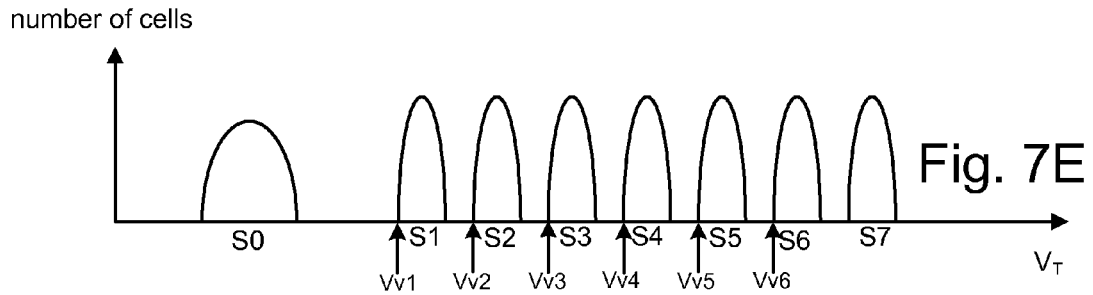

During the second phase of the programming process of FIGS. 7A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 7C.

As can be seen in FIG. 7C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7.

In the third phase of programming, each of data states S1-S7 are tightened so that they no longer overlap with neighboring states. This is depicted graphically by FIG. 7D. The final result of the three phrase programming process is depicted in step 7E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

In some programming processes, coarse/fine programming techniques can be incorporated. For example, memory cells being programmed to a target condition (e.g., Vv2) would first be quickly programmed to coarse condition (e.g., Vv2 less a small voltage) that corresponds to a threshold voltage condition slightly lower than the target condition. Subsequently, the memory cells would be programmed to the target condition in a manner more slowly (and with more precision).

FIGS. 8A-C and 8A-C provide more detail of one example of a coarse/fine programming technique. FIGS. 8A and 9A depict the programming pulses Vpgm applied to the control gate. FIGS. 8B and 9B depict the bit line voltages for the memory cells being programmed. FIGS. 8C and 9C depict the threshold voltage of the memory cells being programmed. This example uses two verify levels, indicated in the Figures as Vver1 and Vver2. The final target level (e.g., verify levels Vv1, Vv2, Vv3, Vv4, Vv5, Vv6, and Vv7 of FIG. 6A) is Vver1. When a threshold voltage of the memory cell has reached Vver1, the memory cell will be inhibited from further programming by applying an inhibit voltage to the bit line corresponding to that memory cell. For example, the bit line voltage can be raised to Vinhibit (See FIG. 8B and FIG. 9B). In one embodiment, Vinhibit is Vdd. However, when a memory cell has reached a threshold voltage close to (but lower than) the target value Vver1, the threshold voltage shift to the memory cell during subsequent programming pulses is slowed down by applying a certain bias voltage to the bit line, typically in the order of 0.3v to 0.8v. Because the rate of threshold voltage shift is reduced during the next few programming pulses, the final threshold voltage distribution can be narrower than otherwise. To implement this method, a second verify level that is lower than that of Vver1 is used. This second verify level is depicted as Vver2. When the threshold voltage of the memory cell is larger than Vver2, but still lower than Vver1, the threshold voltage shift to the memory cell will be reduced for subsequent programming pulses by applying a bit line bias Vs (FIG. 9B). Note that in this case, two verify operations are required for each state. One verify operation at the corresponding Vver1 for each state, and one verify operation at the corresponding Vver2 for each state. This may increase the total time needed to program the memory cells. However, a larger ΔVpgm step size can be used to speed up the process.

FIGS. 8A, 8B, and 8C show the behavior of a memory cell whose threshold voltage moves past Vver2 and Vver1 in one programming pulse. For example, the threshold voltage is depicted in FIG. 8C to pass Vver2 and Vver1 in between t2 and t3. Thus, prior to t3, the memory cell is in the coarse phase. After t3, the memory cell is in the inhibit mode.

FIGS. 9A, 9B, and 9C depict a memory cell that enters both the coarse and fine programming phases. The threshold voltage of the memory cell crosses Vver2 in between time t2 and time t3. Prior to t3, the memory cell is in the coarse phase. After t3, the bit line voltage is raised to Vs; therefore, the memory cell is in the fine phase. In between t3 and t4, the threshold voltage of the memory cell crosses Vver1; therefore, the memory cell is inhibited from further programming by raising the bit line voltage to Vinhibit.

In one embodiment, the coarse/fine programming technique is used for the third phase of the multi-phase programming process of FIGS. 7A-7E, but not for the first two phases. In other embodiments, the coarse/fine programming technique is used for all phases. The coarse/fine programming technique can also be used for full sequence programming.

Figure 10:
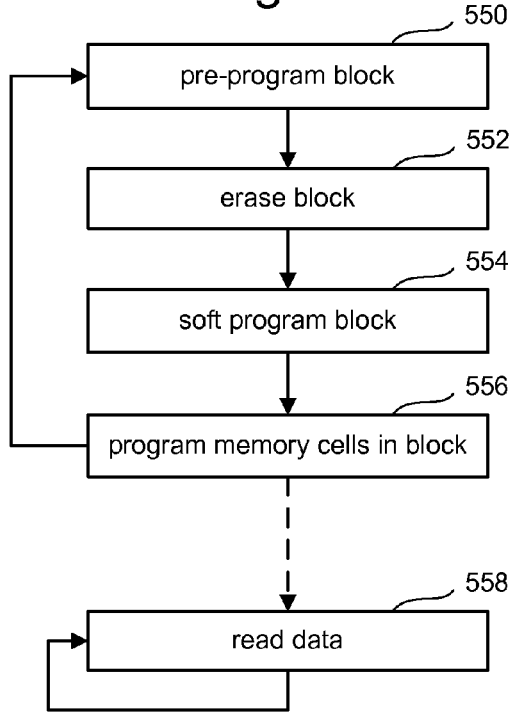
FIG. 10 is a flow chart describing one embodiment of a process for operating non-volatile memory.

FIG. 10 is a flow chart describing a process for operating a non-volatile storage system. In one embodiment, the process of FIG. 10 is used to program a block of memory cells. In one implementation of the process of FIG. 10, memory cells are pre-programmed in order to maintain even wear on the memory cells (step 550). In one embodiment, the memory cells are preprogrammed to the highest data state, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells will be in state S0. One implementation of an erase process includes applying several erase pulses to the p-well and verifying between erase pulses whether the NAND strings are properly erased.

At step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution (e.g., S0).

In step 556, the memory cells of the block are programmed. The programming can be performed in response to a request to program from the host, or in response to an internal process. After programming, the memory cells of the block can be read (step 558). Many different read processes known in the art can be used to read data. In some embodiments, the read process includes using ECC to correct errors. The data that is read is output to the hosts that requested the read operation. The ECC process can be performed by the state machine, the controller or another device.

FIG. 10 shows that the erase-program cycle can happen many times without or independent of reading, the read process can occur many times without or independent of programming, and the read process can happen any time after programming. The process of FIG. 10 can be performed at the direction of the state machine using the various circuits described above. In other embodiments, the process of FIG. 10 can be performed at the direction of the controller using the various circuits described above.

Figure 11:
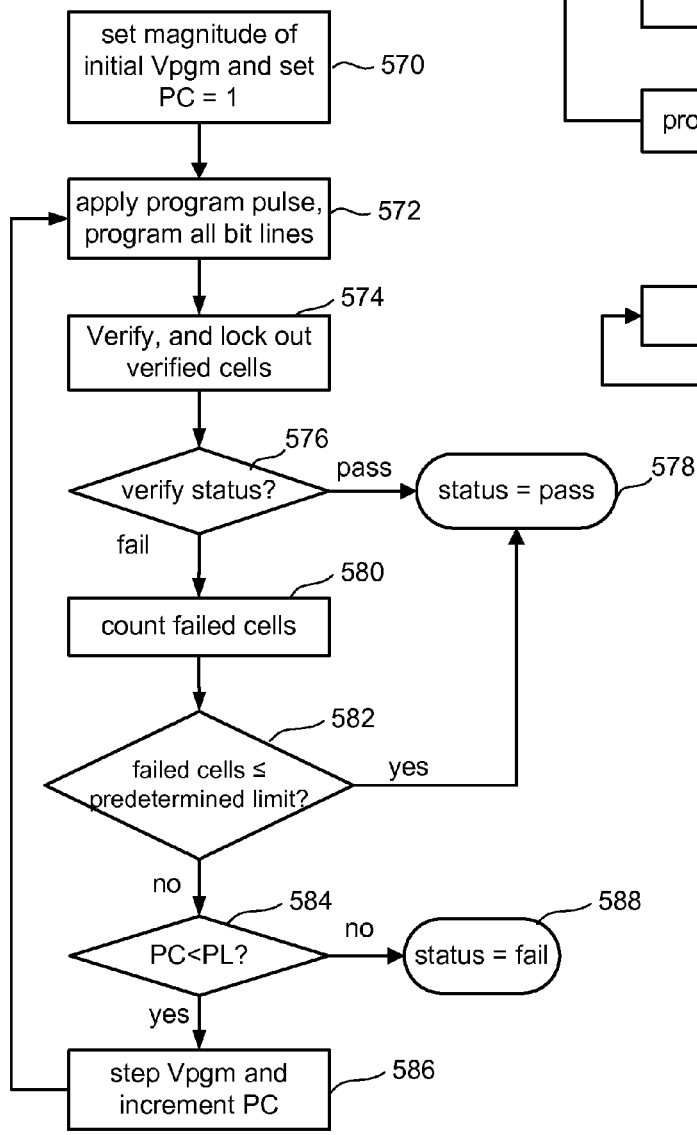
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 11. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 7A-E. For example, when performing the process of FIG. 7A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 7D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. More details of step 574 are described below with respect to FIGS. 12A, 13, 14, 15A and 16A.

In step 576, it is determined whether all the memory cells have reached their target threshold voltages. If so, the programming process is complete and successful because all selected memory cells were programmed and verified to their target states. A status of "PASS" is reported in step 578. If, in 576, it is determined that not all of the memory cells have reached their target threshold voltages, then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree- like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total counted, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 584 and the program counter PC is checked against the program limit value (PL). One example of a program limit value is 20; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Step 574 of FIG. 11 includes performing a verification process for memory cells being programmed and locking out appropriate memory cells from further programming. There are various methods known in the art for verifying memory cells during programming many of which are suitable. FIG. 14A is a flow chart describing one embodiment of a process for performing a verification process (e.g., step 574) during the first phase (see, e.g., FIG. 7B) of the programming process of the embodiment that includes programming according to the method of FIGS. 7A-7E. In step 600, a test is applied to determine whether the various memory cells being programmed have a threshold voltage greater than or equal to VvIM (see FIG. 7B). The memory cells that will remain in threshold voltage distribution E will not need to be verified. The memory cells being programmed to intermediate threshold voltage distribution IM are verified by determining whether the threshold voltage has reached VvIM. In one embodiment, the word line connected to the control gates of the memory cells being programmed will received a voltage at VvIM and the system will test whether the memory cells turn on or not (or conduct or not). The results of the test are determined in step 602. For example, the system will determine which of the memory cells turned on or conducted current in response to VvIM being applied to their control gates. Those memory cells that were determined to have a threshold voltage that has reached VvIM (of those memory cells being programmed to states S4, S5, S6, and S7) will be locked out from further programming for phase 1 in step 604. As discussed above, one example of locking out includes raising the bit line to Vinhibit (e.g., VDD). In step 606, the results of the verification will be reported to the state machine or controller, as suited for the particular implementation.

Figure 12A:
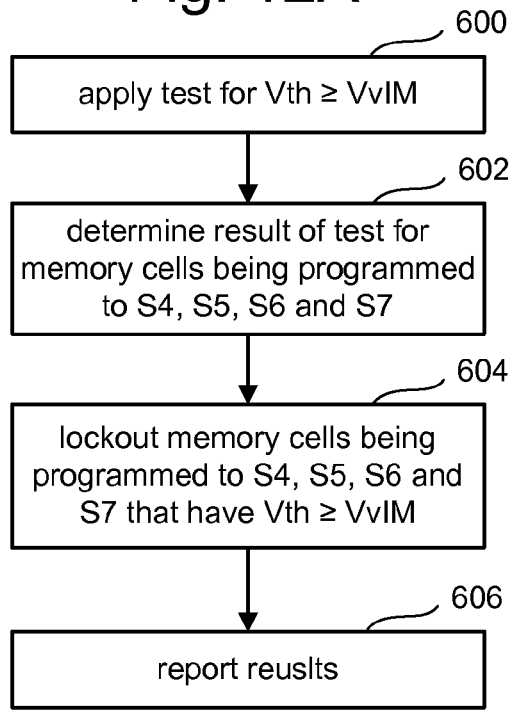
FIG. 12A is a flow chart describing one embodiment of a process for verifying non-volatile memory during programming.
Figure 12B:
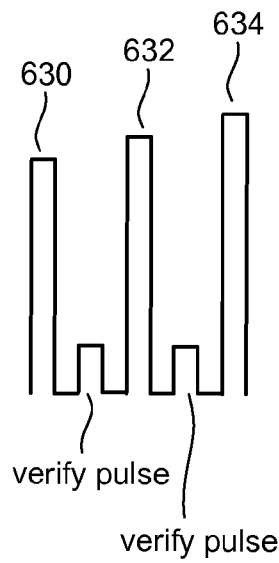
FIG. 12B depicts three programming pulses, and the verify pulses applied between the programming pulses.

FIG. 12B shows sample programming pulses 630, 632, and 634 which are applied at successive iterations of step 572 of FIG. 11. There is a single verify pulse between each pair of programming pulses. The magnitude of the verify pulse is at VvIM for the process of FIG. 14A. Because there is only one verify operation being performed (e.g., the verify operation at VvIM) between successive programming pulses, the verification process is performed fairly quickly.

FIG. 13 is a flow chart describing one embodiment for performing the verification of and locking out of memory cells (step 574) for the third phase of the three phase programming process of FIGS. 7A-7E. That is, the process of FIG. 13 is performed for step 574 when implementing the programming process illustrated in FIG. 7D. In this case, memory cells being programmed to data state S1 are verified at voltage Vv1 which is the lowest voltage of the data state. Memory cells being programmed to data state S2 are verified at Vv2, memory cells being programmed to data state S3 are verified at Vv3, memory cells being programmed to data state S4 are verified at Vv4, memory cells being programmed to data state S5 are verified at Vv5, memory cells being programmed to data state S6 are verified at Vv6, and memory cells being programmed to data state S7 are verified at Vv7.

In step 700 of FIG. 13, the system will test whether the memory cells have a threshold voltage greater than Vv1. In step 702, the system will determine the results of the test for each memory cell being programmed to data state S1. Those memory cells being programmed to state S1 that have a threshold voltage greater than Vv1 are locked out from further programming in step 704.

In step 706, the system will test whether the memory cells have a threshold voltage greater than Vv2. In step 704, the results of the test of step 706 are determined. Those memory cells being programmed to state S2 that have a threshold voltage greater than Vv2 are locked out from further programming in step 710.

In step 712, the system will test whether the memory cells have a threshold voltage greater than Vv3. In step 714, the results of the test of step 712 are determined. Those memory cells being programmed to state S3 that have a threshold voltage greater than Vv3 are locked out from further programming in step 716.

In step 718, the system will test whether the memory cells have a threshold voltage greater than Vv4. In step 720, the results of the test of step 718 are determined. Those memory cells being programmed to state S4 that have a threshold voltage greater than Vv4 are locked out from further programming in step 722.

In step 724, the system will test whether the memory cells have a threshold voltage greater than Vv5. In step 726, the results of the test of step 724 are determined. Those memory cells being programmed to state S5 that have a threshold voltage greater than Vv5 are locked out from further programming in step 728.

In step 730, the system will test whether the memory cells have a threshold voltage greater than Vv6. In step 732, the results of the test of step 730 are determined. Those memory cells being programmed to state S6 that have a threshold voltage greater than Vv6 are locked out from further programming in step 734.

In step 736, the system will test whether the memory cells have a threshold voltage greater than Vv7. In step 738, the results of the test of step 737 are determined. Those memory cells being programmed to state S7 that have a threshold voltage greater than Vv7 are locked out from further programming in step 740. In step 742, the results of the verification process of FIG. 13 are reported to the state machine controller or any other processing device as per the particular implementation.

The wave form for programming pulses and verification pulses applied in association with the process of FIG. 13 is the same as the wave form depicted in FIG. 6B. As can be seen, seven verify pulses are applied because seven verify operations are performed. Because there are so many verify operations performed, the programming process can be slowed down. It is advantageous to speed up the programming process.

One proposal for speeding up the programming process is to reduce the number of verify operations that are performed. In one proposal discussed herein, verify operations are still performed for a first set of data states. However, verify operations are not performed for a second set of data states. For the second set of data states, instead of performing a verification process, the system can determine the number of fast bits of each particular data state. If the number of fast bits are greater than a threshold, then the programming stops for all the memory cells are being programmed to that particular data state by locking out all memory cells are being programmed to that particular data state. In one example implementation, the testing for fast bits can be performed by comparing the threshold voltages (of the memory cells being programmed to the second set of data states) to the verify target levels for the first set of data states. This way no additional operations are performed for the second set of data states. Furthermore, the counting of the number of memory cells that are fast bits for the second set of data states can be performed during the subsequent programming pulse.

Figure 14:
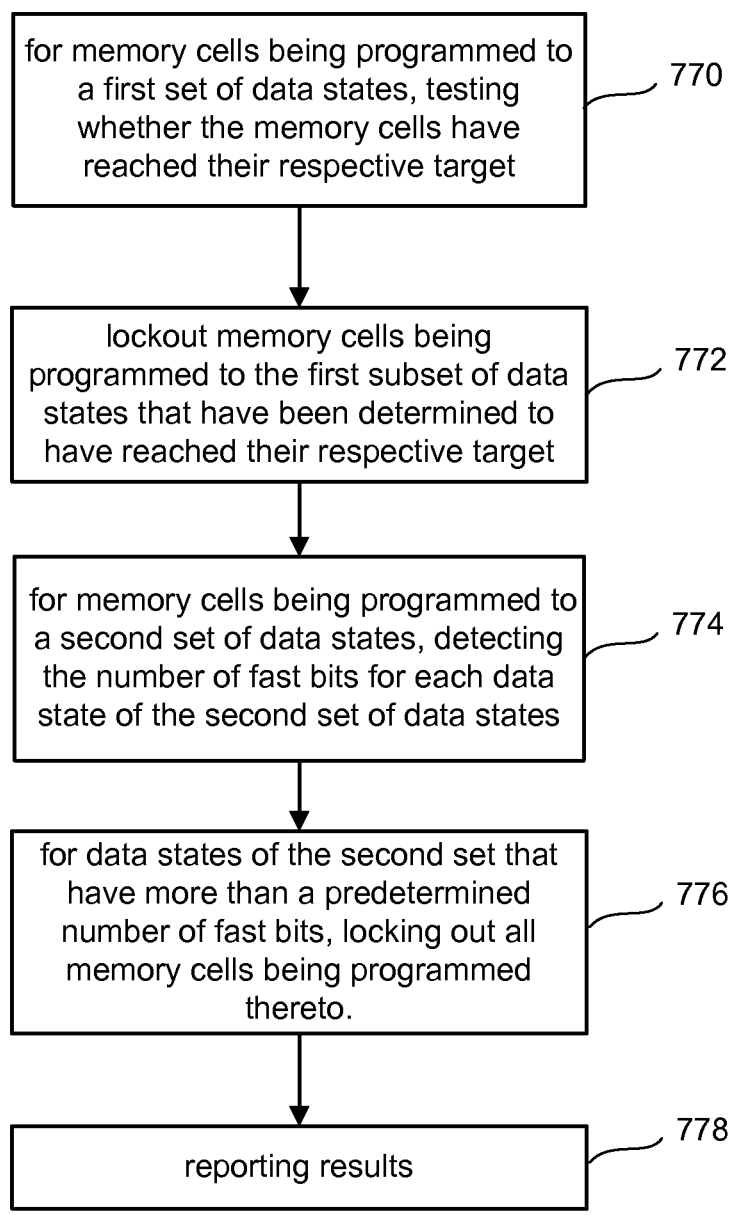
FIG. 14 is a flow chart describing one embodiment of a process for verifying non-volatile memory during programming.

FIG. 14 is a flow chart describing one embodiment of a process for performing the verification and lockout of step 574 using the technology described in the preceding paragraph for speeding up the verification process. In one example implementation, the process of FIG. 14 is used to implement step 574 of FIG. 11 for the second phase of the three-phase programming process of FIGS. 7A-7E. That is, when performing the process of FIG. 7C, the method of FIG. 14 will be used to implement the verification and lockout process of step 574. Note that the process of FIG. 14 can also be used to do the verification and lockout process of step 574 for the third phase of the three phase programming process. Additionally, the process of FIG. 14 can be used with a full sequence programming of FIG. 6A, other multi-phase programming processes, and other programming processes.

In step 770 of FIG. 14, memory cells being programmed to a first set of data states are tested to see whether they have reached their respective targets. As explained above, the data states (e.g., S1-S7) are divided into a first set and second set. The memory cells being programmed to the first set of data states will be verified as discussed above. For example, in step 770, those memory cells being programmed to the first set of data states will be tested to determine whether their threshold voltages have reached their respective verify target level. In one example embodiment, the first set of data states includes data states S2, S4, S6 and S7, and the second set of data states includes data states S1, S3 and S5. Other groupings can also be used Thus, in step 770, the memory cells being programmed to data states S2, S4, S6 and S7 using the process of FIG. 7C will have their threshold voltages compared to Vv3', Vv5', Vv6', and Vv7' to determine whether they reached their intended targets. Those memory cells that have reached their intended targets based on the test of step 770 will be locked out from further programming in step 772.

For the memory cells being programmed to the second set of one or more data state, the system will detect a number of fast bits being programmed to each of the data states of the second set of data states in step 774. In one embodiment, there will be one or more compare levels used to determine what is a fast bit. Memory cells being programmed to the second set of data states will have that threshold voltages compared to the one or more compare levels for fast bits in step 774. In one example, the compare level for determining fast bits is the verify compare level for the next higher data state. For example, to determine the fast bits being programmed to data state S1, the system will test whether the threshold voltage of those memory cells being programmed to data state S1 are than Vv1'. To determine the fast bits being programmed to data state S3, the system will test whether the threshold voltage of those memory cells is greater than Vv4'. To test whether memory cells being programmed to S5 are fast bits, the system will test those memory cells to see whether the threshold voltages are greater than Vv6'. In other embodiments, different compare values can be used to determine whether a bit is a fast bit. For example, a compare value different than the next state's target verify level can be used. Typically a compare value is used that is greater than the target verify level for that data state. Also noted is that the test for fast bits for a particular state X is different than the verification process for state X. Note that other processes can be used for determining whether a bit is a fast bit.

As part of step 774, the system will determine the number of fast bits for each data state. For those data states of the second set of data states that have more than a predetermined number of fast bits, all the memory cells being programmed to that data state are locked out from further programming for this particular programming pass in step 776. In step 778, the results of the verification process are reported to the state machine, controller or other processor.

Looking back at FIG. 7C, it is shown how various data states overlap. That portion of data state S1 that overlaps with data state S2 represents the fast bits. Thus, by testing which memory cells are greater than Vv2', it can be determined which memory cells are fast bits. By characterizing the threshold voltage distribution in advance, it can be predicted, over a large population of memory cells, how many fast bits there will be (e.g., how many bits will have a threshold voltage greater than Vv2') when the threshold voltage distribution for state S1 is in an appropriate condition. Therefore, the predetermined numbers compared against in step 776 are determined based on device characterization in order to stop the programming at the appropriate time. Since data state S1 is being compared to the same value as data state S2, there is only one verify pulse and one verify operation being performed. This saves a considerable amount of time when verifying and, thus, when programming.

In one embodiment, the first set of data states are interleaved with the second set of data states. For example, the first set of data states includes data states S2, S4 and S6, with the second set of data states includes data states S1, S3, and S5.

In another embodiment, the first set of data states includes data states S2-S7, and the second set of data states only includes data state S1. Therefore, the verification process is only skipped for data state S1. FIG. 15A is a flow chart describing one embodiment of the process of performing the verification and locking out of step 574 for the second phase of programming of FIGS. 7A-7E, in the example where the second set of data states only includes data state S1. The process of FIG. 15A is one example implementation of the process of FIG. 14. In step 800, the system will test whether the memory cells have a threshold voltage greater than Vv2'. At step 802, the system will determine the results of the tests for those memory cells being programmed to data state S2. At step 804, those memory cells being programmed to state S2 that have a threshold voltage greater than Vv2' are locked out from further programming. In step 806, the system will determine the result of the test of step 802 for those memory cells being programmed to state S1. In step 808, the system will count the number of memory cells that are being programmed to state S1 that have a threshold voltage greater than Vv2'. In one embodiment, step 808 is performed during the next programming pulse (which means it is performed after all the steps of FIG. 15A). In another embodiment, step 808, as well as all the steps of FIGS. 12, 13, 14, and 15A are performed in response to the previous programming pulse. If the number of memory cells counted in step 808 are greater than some number K (e.g., the predetermined number referenced in step 776), then in step 812 all memory cells being programmed to state S1 are locked out from further programming in this phase of the programming process. Note that steps 806-812 are an example implementation of steps 774-776.

Note that the order of performing steps 802 and 806 can be reversed so that the test for memory cells being programmed S1 is performed before, during or after the test for memory cells being programmed S1.

After step 812 is performed, step 814 is performed. If in step 810 the system determines that the number of memory cells counted in step 808 is not greater than K, then the process will skip step 812 and go right to step 814. Note that the number K compared in step 810 need not be predetermined in some embodiments.

In step 814, the system will test whether the memory cells have a threshold voltage greater than Vv3'. In step 816, the system will determine the results of the test for memory cells being programmed to state S3. In step 818, those memory cells that are being programmed to state S3 that have a threshold old voltage greater than Vv3' will be locked out from further programming. In step 820, the system will test whether the memory cells have a threshold voltage greater than Vv4'. In step 822, the system will determine the results of the test for memory cells being programmed to data state S4. Those memory cells being programmed to state S4 that have a threshold voltage greater than Vv4' will be locked out for further programming in step 824. In step 826 the system will apply a test to determine whether memory cells have a threshold voltage greater than Vv5'. In step 828, the system will determine the results of the test for those memory cells being programmed to data state S5. In step 830, those memory cells that are being programmed to data state S5 and have a threshold voltage greater than Vv5' will be locked out from further programming.

In step 832, the system will apply the test for determining which memory cells have a threshold voltage greater than Vv6'. In step 834, the system will determine the results of the test from memory cells being programmed to state S6. In step 836, those memory cells that are being programmed to state S6 and have a threshold voltage greater than Vv6' will be locked out from further programming. In step 838, the system will apply the test to determine which memory cells have a threshold voltage greater than Vv7'. In step 840, the system will determine the results of the test for those memory cells being programmed to data state S7. In step 842, those memory cells that are being programmed to data state S7 and have a threshold voltage greater than Vv7' will be locked out from further programming. In step 844, the results of the verification process are provided to the state machine, controller or other processor, as per the implementation.

Figure 15B:
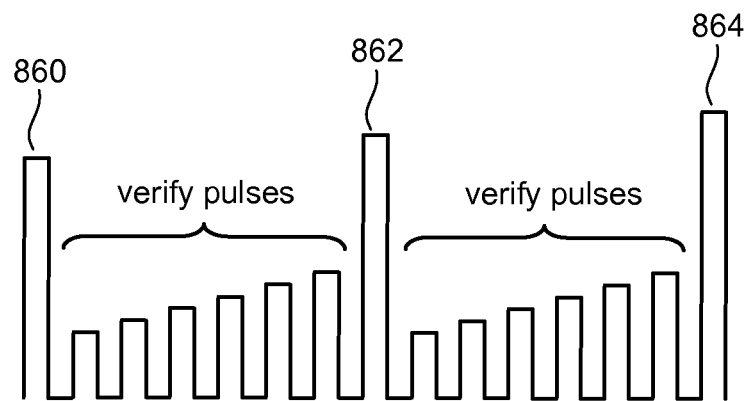
FIG. 15B depicts programming pulses, and the verify pulses applied between the programming pulses.

FIG. 15B depicts a set of three program pulses and the verify pulses that are applied between the three program pulses during the process of FIG. 15A. Between program pulses 860, 862 and 864, there are only six verification pulses. The magnitude of the six verification pulses are at Vv2', Vv3', Vv4', Vv5', Vv6', and Vv7'. There is no verification pulses at Vv1' because the verification for state S1 was skipped.

Figure 16B:
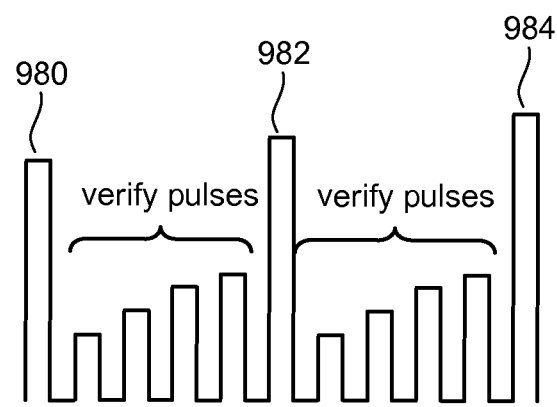
FIG. 16B depicts programming pulses, and the verify pulses applied between the programming pulses.
Figure 16A:
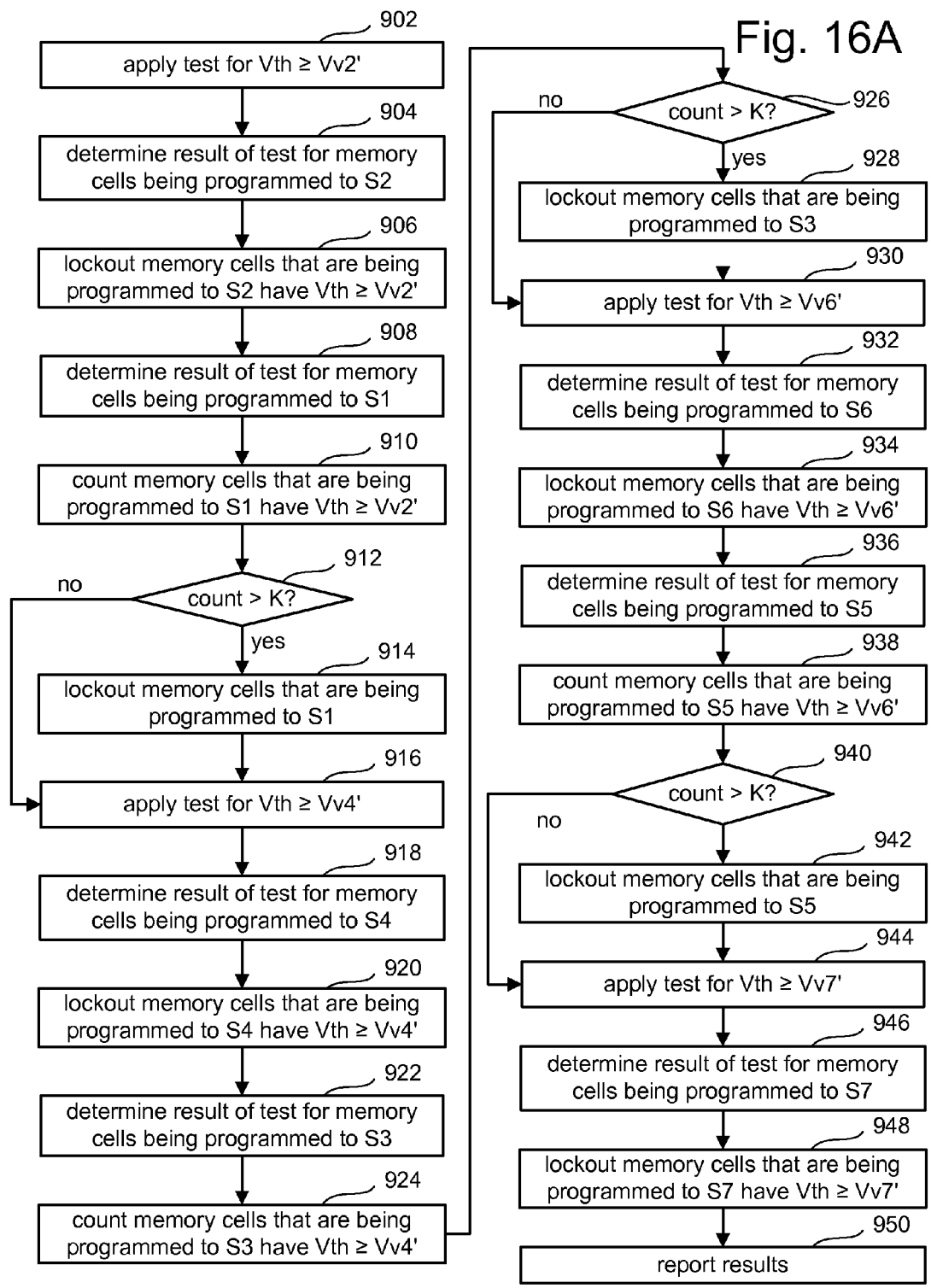
FIG. 16A is a flow chart describing one embodiment of a process for programming non-volatile memory.

FIG. 16A is a flow chart describing one embodiment of the process of performing the verification and locking out of step 574 for the second phase of programming of FIGS. 7A-7E, in the example where the second set of data states includes data states S1, S3 and S5. In the embodiment of 16A, verification is skipped for data states S1, S3 and S5. Thus, data states S1, S3 and S5 are in the second set of data states, and the second set of data states are interleaved with the first set of data states. The first set of data states includes S2, S4, S6 and S7.

In step 902 of FIG. 16A, the system applies the test for determining whether memory cells have threshold voltage greater than Vv2'. In step 904, the system determines the results of the test for memory cells being programmed to state S2. In step 906, memory cells that are being programmed to state S2 that have a threshold voltage greater than Vv2' are locked out from further programming. In step 908, the system determines the result of the test of FIG. 904 from memory cells being programmed to data state S1. That is, those memory cells being programmed to data state S1 have their threshold voltage compared to Vv2'. In step 910, the system counts the number of memory cells that are being programmed to state S1 that have their threshold voltage greater than Vv2'. In one embodiment, step 910 is performed during the next program pulse (which means it is after all the steps of FIG. 16A). In step 912, the system determining whether the number of memory cells counted in step 910 is having their threshold voltage greater than Vv2' is greater than some number K. If not, the process proceeds to step 916. If the number of memory cells being programmed to state S1 that have their threshold voltage greater than Vv2' is greater than K then all the memory cells being programmed to data state S1 are locked out from further programming at step 914. Note that steps 908-914 are an example implementation of steps 774-776.

Note that the order of performing steps 904 and 908 can be reversed so that the test for memory cells being programmed S1 is performed before, during or after the test for memory cells being programmed S1.

In step 916 of FIG. 16A, the system applies a test to determine whether the memory cells have their threshold voltage greater than Vv4'. In step 918, the system determines the result of the test of the memory cells being programmed to state data state S4. In step 920, memory cells that are being programmed to data state S4 that have their threshold voltage greater than Vv4' are locked out from further programming. In step 922, the result of the test of step 916 is determined for those memory cells being programmed to data state S3. In this embodiment, verification for data states S1, S3 and S5 are being skipped. Therefore, memory cells being programmed for data state S3 are compared to verify target level Vv4' for data state S4. In step 924, the number of memory cells that are being programmed to data state S3 that have their threshold greater than Vv4' are counted. If that count is greater than some number K (step 926), then all memory cells being programmed at this data state S3 are locked out in step 928. Note that steps 922-928 are an example implementation of steps 774-776.

Note that the order of performing steps 918 and 922 can be reversed so that the test for memory cells being programmed S3 is performed before, during or after the test for memory cells being programmed S4.

In step 930, a test is applied to the memory cells to determine whether their threshold voltages are greater than Vv6'. At step 932, the results for the test for those memory cells being programmed to data state S6 is determined. In step 934, the memory cells that are being programmed to data state S6 that have their threshold voltage greater than Vv6 are locked out from further programming. In step 936, the results of the test of step 930 is determined for each of the memory cells being programmed to data state S5. Remember that data state S5 is being skipped from verification, as discussed above. At step 938, the number of memory cells being programmed to data state S5 that have their threshold voltage rated in Vv6' are counted. If that count is greater than some number K (step 940) then all memory cells being programmed to data state S5 are locked out from further programming. If the count is not greater than the number K, then the process skips step 942 and continues at step 944. Note that steps 936-942 are an example implementation of steps 774-776.

Note that the order of performing steps 932 and 936 can be reversed so that the test for memory cells being programmed S5 is performed before, during or after the test for memory cells being programmed S6.

In step 944, the memory cells are tested to determine whether their threshold voltage is greater than Vv7'. In step 946, the results of the test of step 944 are determined for those memory cells being programmed to data state S7. In step 948, the memory cells being programmed to data state S7 that have their threshold voltage greater than Vv7' are locked out from further programming. In step 950, the results of the above-described verification process is reported to the state machine, controller or other processor. Note that steps 912, 926 and 940 use the same value K; however, in other embodiments, different numbers can be used for the comparison of steps 912, 926 and 940.

FIG. 16B depicts three programming pulses, Between successive programming pulses are four verify pulses having magnitudes of Vv2', Vv4', Vv6', and Vv7'. The pulses of FIG. 16B are applied during the process of FIG. 16A. There are no verify pulses at magnitude Vv1', Vv3' or Vv5' because verification has been skipped for data states S1, S3 and S5. By skipping the verification for certain data states, the programming process completes faster. When the method of FIG. 16A is used for the third programming pass of FIGS. 7A-E, rather than using Vv1', Vv2', Vv3', Vv4', Vv5', Vv6', and Vv7', the system will use Vv1, Vv2, Vv3, Vv4, Vv5, Vv6 and Vv7. Additionally, the processes of FIGS. 15A and 16A can be used for other programming processes in addition to the processes of FIG. 6 and FIGS. 7A-E.

In another embodiment, the second set of data states can include data states S1, S4 and S6 such that verification is skipped for data states S1, S4 and S6 and verification is performed for data states S2, S3, S5 and S7—in general accordance with the principles discussed above. When verifying for S2, the system test for fast bits for S1. When verifying for S5, the system test for fast bits for S4. When verifying for S7, the system test for fast bits for S6. Other configurations can also be implemented.

One embodiment includes applying programming to a first set of non-volatile storage elements being programmed to a first set of targets and to a second set of non-volatile storage elements being programmed to a second set of one or more targets, testing whether the first set of non-volatile storage elements have reached their respective target, locking out from further programming non-volatile storage elements of the first set of non-volatile storage elements that have been determined to have reached their respective target, detecting a number of fast programming non-volatile storage elements of the second set of non-volatile storage elements for each target of the second set of one or more targets, and locking out from further programming non-volatile storage elements of the second set of non-volatile storage elements that are being programmed to one or more targets of the second set of one or more targets that have more than a threshold number of fast programming non-volatile storage elements being programmed thereto.

One embodiment includes a plurality of non-volatile storage elements including a first set of non-volatile storage elements being programmed to a first set of one or more targets and a second set of non-volatile storage elements being programmed to a second set of one or more targets, and one or more managing circuits in communication with the plurality of non-volatile storage elements. The one or more managing circuits apply doses of programming to the first set of non-volatile storage elements and the second set of non-volatile storage elements. In response to at least a subset of the doses of programming, the one or more managing circuits test whether the first set of non-volatile storage elements have reached their respective target, lock out from further programming non-volatile storage elements of the first set of non-volatile storage elements that have been determined to have reached their respective target, detect a number of fast programming non-volatile storage elements of the second set of non-volatile storage elements for each target of the second set of one or more targets, and lock out from further programming non-volatile storage elements of the second set of non-volatile storage elements that are being programmed to one or more targets of the second set of one or more targets that have more than a threshold number of fast programming non-volatile storage elements being programmed thereto.

One embodiment includes programming a plurality of non-volatile storage elements to interim targets. The plurality of non-volatile storage elements include a first set of non-volatile storage elements being programmed to a first set of interim targets and to a second set of non-volatile storage elements being programmed to a second set of one or more interim targets. The programming of the plurality of non-volatile storage elements to the interim targets includes locking out non-volatile storage elements of the first set based on detecting whether non-volatile storage elements of the first set have reached their respective interim target and locking out non-volatile storage elements of the second set based on detecting fast programmed non-volatile storage elements of the second set. The method further comprises programming the plurality of non-volatile storage elements from the interim targets to final targets including locking out non-volatile storage elements of the first set based on detecting whether non-volatile storage elements of the first set have reached their respective target and locking out non-volatile storage elements of the second set based detecting whether non-volatile storage elements of the second set have reached their respective target.

One embodiment includes a plurality of non-volatile storage elements including a first set of non-volatile storage elements being programmed to a first set of interim targets and a second set of non-volatile storage elements being programmed to a second set of one or more interim targets, and one or more managing circuits in communication with the plurality of non-volatile storage elements. The one or more managing circuits program the plurality of non-volatile storage elements to interim targets. As part of the programming of the plurality of non-volatile storage elements to interim targets, the one or more managing circuits lock out non-volatile storage elements of the first set based on detecting whether non-volatile storage elements have reached their respective interim target and lock out non-volatile storage elements of the second set based on detecting a threshold number of fast programmed non-volatile storage elements of the second set. The one or more managing circuits program the plurality of non-volatile storage elements from the interim targets to final targets including locking out non-volatile storage elements of the first set based on detecting whether non-volatile storage elements of the first set have reached their respective target and locking out non-volatile storage elements of the second set based detecting whether non-volatile storage elements of the second set have reached their respective target.

One embodiment includes applying a programming signal to a first set of non-volatile storage elements in order to program the first set of non-volatile storage elements to a first target, testing whether the non-volatile storage elements of the first set have reached a different target that is greater than the first target, determining whether the amount of non-volatile storage elements of the first set that have reached a different target is greater than a first number, and concluding programming of the first set of non-volatile storage elements in response to determining that the amount of non-volatile storage elements of the first set that have reached the different target is greater than the first number.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of programming non-volatile storage, comprising:
  applying a programming signal to a first set of non-volatile storage elements in order to program the first set of non-volatile storage elements to a first target;
  testing whether the non-volatile storage elements of the first set have reached a different target that is greater than the first target;
  determining whether the amount of non-volatile storage elements of the first set that have reached a different target is greater than a first number; and
  concluding programming of the first set of non-volatile storage elements in response to determining that the amount of non-volatile storage elements of the first set that have reached the different target is greater than the first number.

2. The method of claim 1, wherein:
  the programming signal includes a set of program pulses, the determining includes counting non-volatile storage elements of the first set that have reached the different target in response to at least some of the pulses.

3. The method of claim 1, wherein:
  the concluding programming of the first set of non-volatile storage elements includes locking out from further programming non-volatile storage elements of the first set of non-volatile storage elements in response to determining that the amount of non-volatile storage elements of the first set that have reached the different target is greater than the first number.

4. The method of claim 1, further comprising:
  applying a programming signal to a second set of one or more non-volatile storage elements in order to program the second set of non-volatile storage elements to a second target;
  determining whether the second set of non-volatile storage elements have reached the second target; and
  concluding programming non-volatile storage elements of the second set of non-volatile storage elements that have been determined to have reached the second target.

5. The method of claim 4, wherein:
  the testing whether the non-volatile storage elements of the first set have reached a different target that is greater than the first target includes testing whether a subset of the first set of non-volatile storage elements have reached the second target.

6. The method of claim 4, wherein:
  the second target is interleaved with the first target.

7. The method of claim 4, wherein:
  the applying a programming signal, testing whether the non-volatile storage elements of the first set have reached a different target that is greater than the first target, determining whether an amount of non-volatile storage elements of the first set that have reached a different target is greater than a first number, concluding programming of the first set of non-volatile storage elements, determining whether the second set of non-volatile storage elements have reached the second target, and concluding programming non-volatile storage elements of the second set of non-volatile storage elements are performed as part of an interim programming phase that programs the first set of non-volatile storage elements and the second set of non-volatile storage elements to interim conditions;

the method further includes a programming phase subsequent to the interim programming phase that includes programming the first set of non-volatile storage elements and the second set of non-volatile storage elements to final target conditions different than the interim conditions; and the subsequent programming phase further comprises testing whether the first set of non-volatile storage elements and the second set of non-volatile storage elements have reached their respective final target conditions.

8. The method of claim 7, further comprising:

performing a programming phase prior to the interim programming phase for a subset of the second set of non-volatile storage elements.

9. The method of claim 1, wherein:

the testing whether the non-volatile storage elements of the first set have reached a different target that is greater than the first target includes testing whether non-volatile storage elements of the first set of non-volatile storage elements are over programmed.

10. The method of claim 2, wherein:

the determining whether the amount of non-volatile storage elements of the first set that have reached the different target includes counting the number of non-volatile storage elements of the first set that have reached the different target during one of the program pulses.

11. A non-volatile storage system, comprising:

a plurality of non-volatile storage elements including a first set of non-volatile storage elements being programmed to a first target; and one or more managing circuits in communication with the plurality of non-volatile storage elements, the one or more managing circuits apply programming to the first set of non-volatile storage elements;

in response to the programming the one or more managing circuits test whether non-volatile storage elements of the first set have reached a different target that is greater than the first target, determine whether an amount of non-volatile storage elements of the first set that have reached a different target is greater than a first number and conclude programming of the first set of non-volatile storage elements in response to determining that the amount of non-volatile storage elements of the first set that have reached the different target is greater than the first number.

12. The non-volatile storage system of claim 11, wherein:

the programming includes program pulses, the one or more managing circuits determine whether the amount of non-volatile storage elements of the first set that have reached the different target is greater than the first number by counting non-volatile storage elements of the first set that have reached the different target during one of the program pulses.

13. The non-volatile storage system of claim 11, wherein:

the one or more managing circuits conclude programming of the first set of non-volatile storage elements by locking out from further programming all non-volatile storage elements of the first set of non-volatile storage elements in response to determining that the amount of non-volatile storage elements of the first set that have reached the different target is greater than the first number.

14. The non-volatile storage system of claim 11, wherein:

the plurality of non-volatile storage elements includes a second set of non-volatile storage elements; and the one or more managing circuits apply programming to the second set of one or more non-volatile storage elements in order to program the second set of non-volatile storage elements to a second target, determine whether the second set of non-volatile storage elements have reached the second target in response to the programming and conclude programming non-volatile storage elements of the second set of non-volatile storage elements that have been determined to have reached the second target.

15. The non-volatile storage system of claim 14, wherein:

the one or more managing circuits test whether non-volatile storage elements of the first set have reached a different target that is greater than the first target by testing whether the first set of non-volatile storage elements have reached the second target.

16. The non-volatile storage system of claim 14, wherein:

the second target is interleaved with the first target.

* * * * *